(12) United States Patent
Ooe et al.

(10) Patent No.: US 6,483,040 B2
(45) Date of Patent: Nov. 19, 2002

(54) PACKAGE AND METHOD OF MANUFACTURING THE SAME

(75) Inventors: Satoshi Ooe, Itami (JP); Yoshiyuki Yamamoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 8 days.

(21) Appl. No.: 09/789,581

(22) Filed: Feb. 22, 2001

(65) Prior Publication Data
US 2001/0024725 A1 Sep. 27, 2001

(30) Foreign Application Priority Data
Mar. 2, 2000 (JP) .......................................... 2000-057200

(51) Int. Cl.⁷ .................................................. H05K 1/03
(52) U.S. Cl. ........................ 174/256; 174/252; 361/720; 428/408
(58) Field of Search ................................. 174/256, 255, 174/252; 438/125; 361/720; 428/408

(56) References Cited

U.S. PATENT DOCUMENTS

| 5,354,717 A | * | 10/1994 | Pollock et al. ............... 438/125 |
| 5,508,230 A | | 4/1996 | Anderson et al. |
| 5,508,885 A | * | 4/1996 | Ishimoto ..................... 361/720 |
| 5,545,598 A | * | 8/1996 | Ogawa et al. ............... 501/127 |
| 5,858,537 A | * | 1/1999 | Brown et al. ................ 428/408 |

FOREIGN PATENT DOCUMENTS

JP 11-345922 12/1999

* cited by examiner

Primary Examiner—Albert W. Paladini
(74) Attorney, Agent, or Firm—McDermott, Will & Emery

(57) ABSTRACT

The present invention provides a package whose heat dissipation performance by a semiconductor device has been improved, which synchronizes with the rapid development of high transmission density in multiplex communications. In place of the conventional package substrate, a substrate formed by a combination of two or more kinds of materials is used, whereby the temperature of a portion at which the temperature tends to rise to become extremely high within the package is selectively dissipated, whereby the heat dissipation performance of the package is efficiently improved. A diamond coated substrate or diamond substrate is used at a portion with an extremely high temperature for dissipating the heat.

6 Claims, 7 Drawing Sheets

Package No. 1

Peak temperature (× mark): 129.3°C

PACKAGE AND METHOD OF MANUFACTURING THE SAME

BACKGROUND OF THE INVENTION

1. Field of the Invention

The present invention relates to a package to be used for telecommunication or the like, and in particular, a package to be mounted with a semiconductor which requires heat dissipation performance, and a method of manufacturing the package.

2. Description of the Related Art

Conventionally, for a package to be mounted with a semiconductor, a method has been used whereby a plate of CuW and a plate of AlN ceramics, which have excellent heat dissipation performance, are used for the bottom of the package so as to dissipate heat generated due to the operation of the semiconductor. Such a bottom plate is called a substrate, and heat dissipation performance has been improved by employing these substrates in comparison with substrates of alumina-ceramics, an Fe—Ni—Co alloy (trade name: Covar), and a 42 alloy (Fe—Ni alloy).

Furthermore, a thermo electric cooler using the Peltier effect has been used. This cooler uses a phenomenon called the "Peltier effect". When a current is supplied to a semiconductor, the heat of one side semiconductor is carried to another side. The heat absorbing side of the semiconductor is cooling. The thermo electric cooler combined with this semiconductor has a significant effect, however, in that its thickness increases since the device itself requires a combination of the semiconductor device and a substrate.

However, since entering year 2000, multiplex telecommunication in which the signal channel is great has become the mainstream in the field of telecommunication systems. For example, the wavelength division multiplexing (WDM) method is rapidly spreading in the field of optical communications, and the wide Band-CDMA method which has been used in cellular phones is rapidly growing in the field of radio communications.

In these markets, in order for the device to satisfy performance of high output and low-distortion, it is necessary to lower the operating temperature of the device. As a means for accomplishing this, the heat dissipation performance of the package has been improved, and it is particularly important that the heat dissipation from a heatsink or the like, on which a thermo electric cooler is mounted, is improved heat absorbing ability toward the direction of the substrate. AlN ceramics and CuW which are the materials of the above-mentioned substrates also have a sufficient effect for improving the heat dissipation performance, however, a device with a high output whose heat dissipation performance is further improved has been demanded.

As one of means for satisfying this demand, electric cooling using the above-mentioned thermo electric cooler is used. However, since the device includes a combination of a semiconductor and a substrate, the volume increases and electric circuits for cooling become necessary in comparison with the case of using only one substrate.

In addition, in Japanese Unexamined Patent Publication No. 345922 of 1999, a package using diamond which has excellent heat dissipation performance is disclosed. In this example, vapor-phase synthetic diamond and a metal member with high heat conductivity are laminated to improve heat dissipation performance, however, since a diamond having a considerably larger area than that of a semiconductor device to be mounted is used, although the cost of this package can be reduced, the reduction in the cost is limited.

In order to use a material as a substrate of a package, it is necessary to improve the heat conductivity of the material to be used as a substrate. As materials with high heat conductivity, diamond can be used as well as metals including Au, Ag, Cu and others. However, a diamond plate or a diamond-coated plate is costly. Consequently, the use of diamond as a material composing a large substrate is too high-cost.

SUMMARY OF THE INVENTION

The invention achieves a means for improving heat dissipation performance while reducing the amount of use of an expensive diamond plate or diamond coated plate. In the means, a diamond plate or diamond coated plate is used as a substrate immediately under a highly heated portion of an IC. Concretely, the substrate is formed by connecting two or more kinds of substrates which are different in heat conductivity.

Concretely, a substrate of one kind selected from plates of diamond coated AlN ceramics, diamond coated Si, and diamond and one or more kinds of substrates selected from AlN ceramics, Si, and CuW are combined and used. The diamond coated portion or the diamond plate portion is positioned immediately under the intensest heated portion of the IC. That is, in the package, the substrate with high performance heat dissipation is disposed under a portion of which the temperature may become especially high. For a substrate to be disposed at a position other than the position immediately under the highly heated portion, one or more kinds of substrates of AlN ceramics, Si, and CuW are used. In a case where the diamond plate is used, any kind of substrate can be used, however, in a case where the diamond coated substrate is used, it is preferable that the same material as the coated material is used. Needless to say, the diamond substrate and the diamond coated substrate may be combined and used.

In all cases, the method of manufacturing the package is as follows. First, a ceramics frame which has been subjected to an electrode frame of the package is combined with external leads and fixed. At the time of attaching substrates on the fixed ceramics frame, two or more kinds of substrates are prepared, and lined-up and adhered on the substrate's mountable side of the frame. At the same time, the substrates are connected to each other by brazing. After adhering, in order to make the thicknesses of the substrates even, the backside surfaces of the package frame are ground to be flat. At this time, in order to secure heat dissipation performance which is the object of the invention, it is preferable that a diamond plate or diamond coated substrate is used for a part of the substrate. In addition, the coated diamond is disposed so as to face the interior of the package. Two or more kinds of substrates which are different in heat conductivity are used as the substrate, and in order to suppress distortion due to a difference in the thermal expansion coefficient from diamond, it is preferable that substrates of AlN ceramics, Si, and CuW are selected and used which have a small difference in the thermal expansion coefficient from diamond.

These materials have excellent heat conductivity and a small thermal expansion coefficient, and in comparison with the diamond's thermal expansion coefficient of $2.3 \times 10^{-6}/°$ C., the thermal expansion coefficient of AlN is $4.5 \times 10^{-6}/°$ C., the thermal expansion coefficient of Si is $3.3 \times 10^{-6}/°$ C., and the thermal expansion coefficient of CuW is approximately $6.5 \times 10^{-6}/°$ C. in the case where the Cu ratio in the composition is small although it changes depending on its composition. Therefore, by using these materials, distortion due to the difference in the thermal expansion coefficient can be prevented provided that the difference in the temperature between the materials and diamond does not increase.

The package of the invention has a heat dissipation performance superior to that of the conventional package, and its distortion due to heat generation is within an allowable range, and the cost of the package can be reduced by minimizing the amount of expensive diamond to be used.

BRIEF DESCRIPTION OF THE DRAWINGS

The foregoing and other features and advantages of the present invention will become increasingly appreciated as a better understanding of the same is acquired by reference to the following detailed description when taken into conjunction with the accompanying drawings wherein.

DETAILED DESCRIPTION OF THE PREFERRED EMBODIMENT

Figure 1:
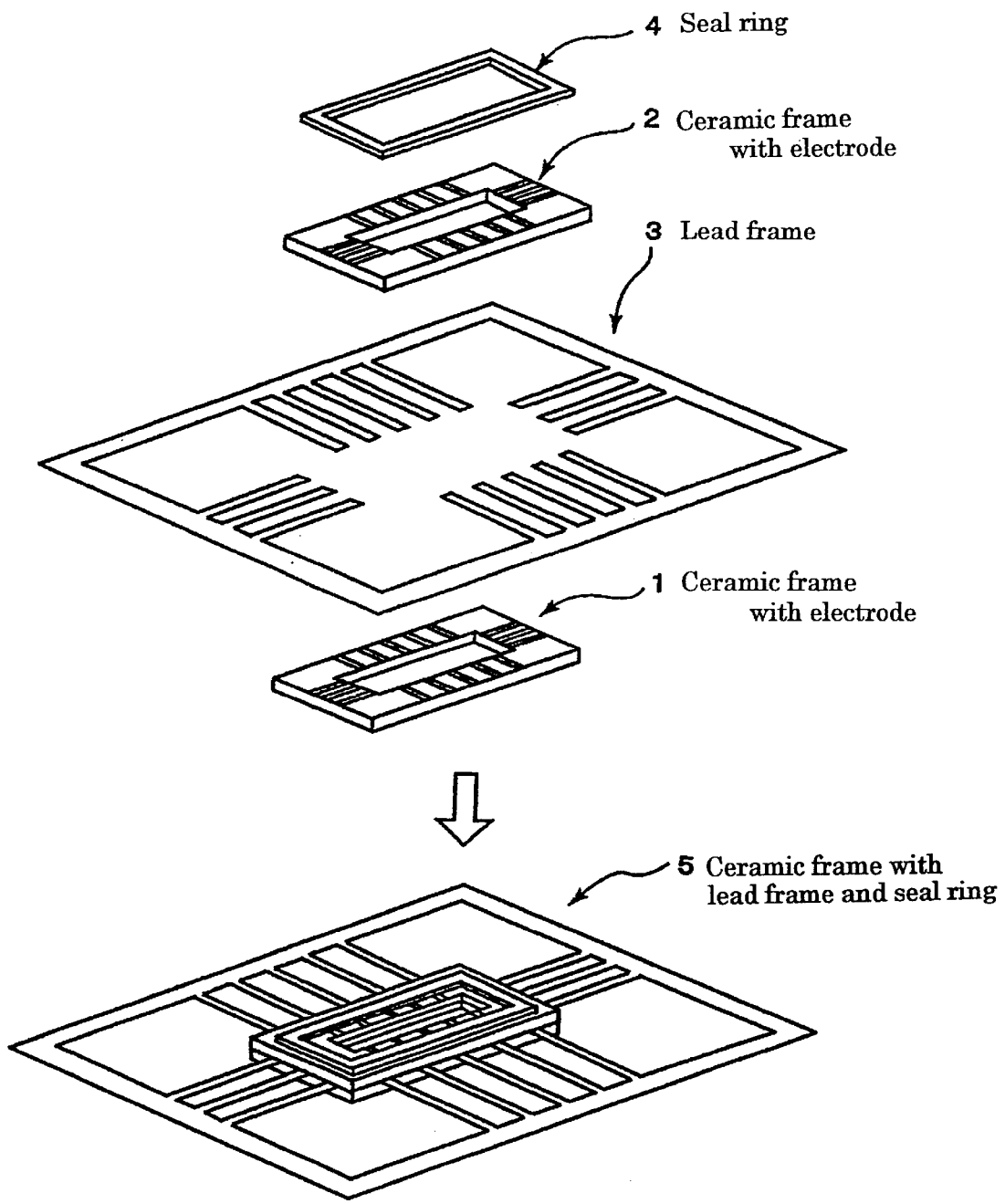
FIG. 1 shows the first half of the processes of the method of manufacturing the package of the invention.
Figure 2:
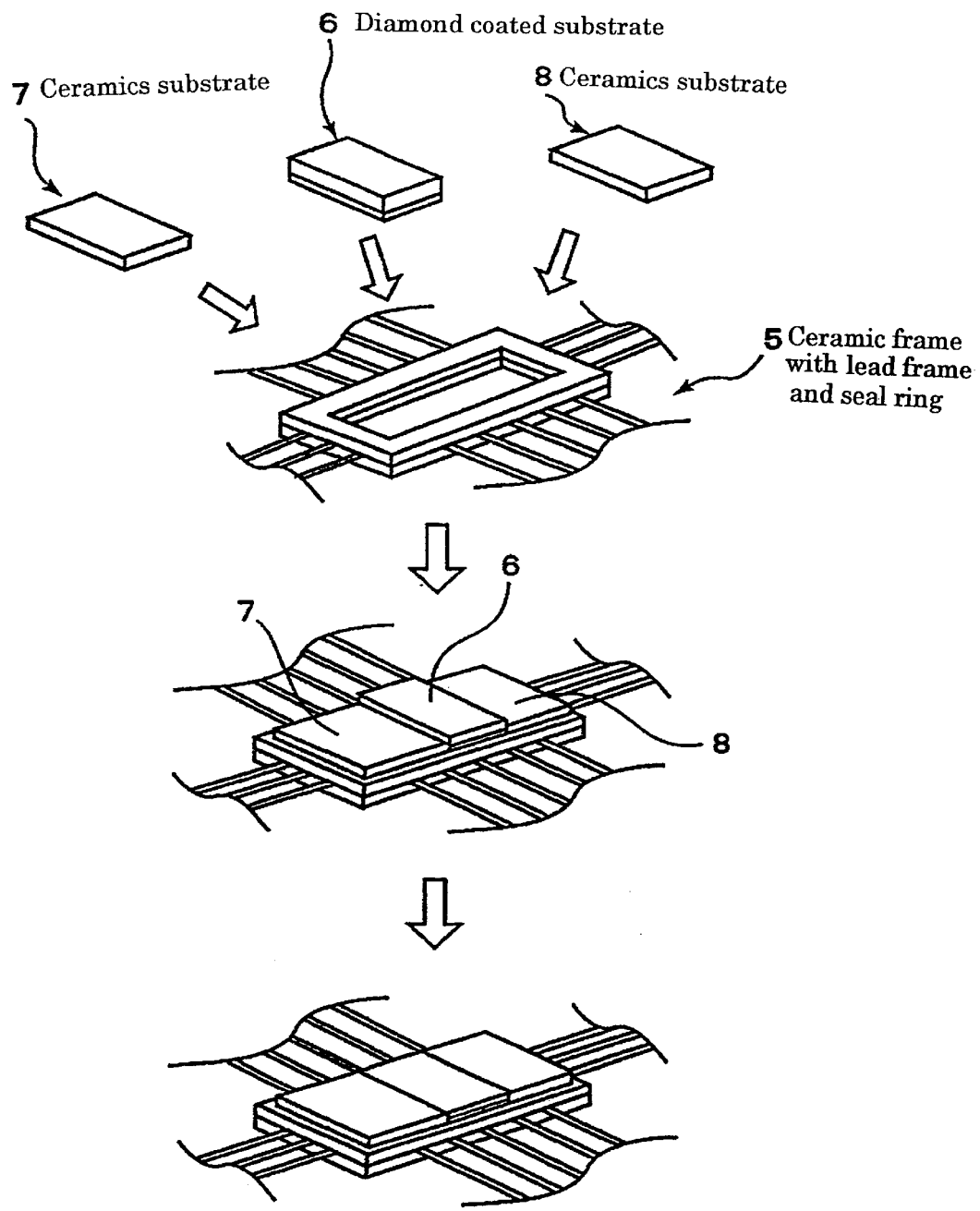
FIG. 2 shows the latter half of the processes of the manufacturing method of the package of the invention.

The outline of the method of manufacturing the package of the invention is shown in FIGS. 1 and 2. Ceramic frames with electrode 1 and 2 which have been prepared as a preprocess (FIG. 1), lead frame 3, and seal ring 4 are prepared and connected by brazing or soldering so as to have a predetermined form, whereby frame 5 is manufactured. Each electrode frame 1 and 2 is a part which forms a package or a portion of a package frame, and each electrode frame comprises ceramic, has a hole in the center and an electrode. Each electrode frame 1 and 2 is a part which forms a package or a portion of a package frame, and each electrode frame comprises ceramic, has a hole in the center and an electrode. Processes up to this process are the same as in the prior-art. Next, the frame 5 is turned over as a postprocess (FIG. 2), and the substrates are adhered. In the figure, two kinds of substrates, diamond coated substrate 6 and ceramics substrates 7 and 8 are used, however, two or more substrate may be used. The diamond coated substrate is disposed at the portion at which a intensely-heating IC is mounted. If this position is inaccurate, the use of such a high-dissipation substrate is meaningless. At portions other than this portion, since the heating density of the device is smaller, it is unnecessary to use the diamond substrate or diamond coated substrate.

The diamond coated substrate 6 and ceramics substrates 7 and 8 are adhered to the substrate side of the frame 5 by soldering. At this time, it is necessary that the diamond coated substrate 6 is produced so as to be slightly thicker than the ceramics substrates 7 and 8. In a case where the diamond substrate is used, other substrates to be combined must be made thick. In addition, the substrates must be connected together by soldering. After the connection, grinding is performed from the back surface so that the entirety of the substrates becomes flat. After grinding, the substrates are metallized as necessary, and then turned over and mounted with a semiconductor, and other devices, and circuits are formed by using Au conductors and others, and thereafter, a cap is connected to the seal ring side to seal up the frame. The cap may be adhered by a welding or the like. Even if seal ring is not employed, the cap can be adhered by the resin.

The package is manufactured through the abovementioned processes, and for the combination of the substrates, it is preferable that a diamond substrate or diamond coated substrate is used at the intensely heated portion, and at other portions a substrate with a small difference in thermal conductivity from diamond is used. That is, it is preferable that such a substrate is selected from AlN ceramics, Si, and CuW. It is also preferable that AlN or Si is used as the material to be coated with diamond of the diamond coated substrate.

Figure 4:
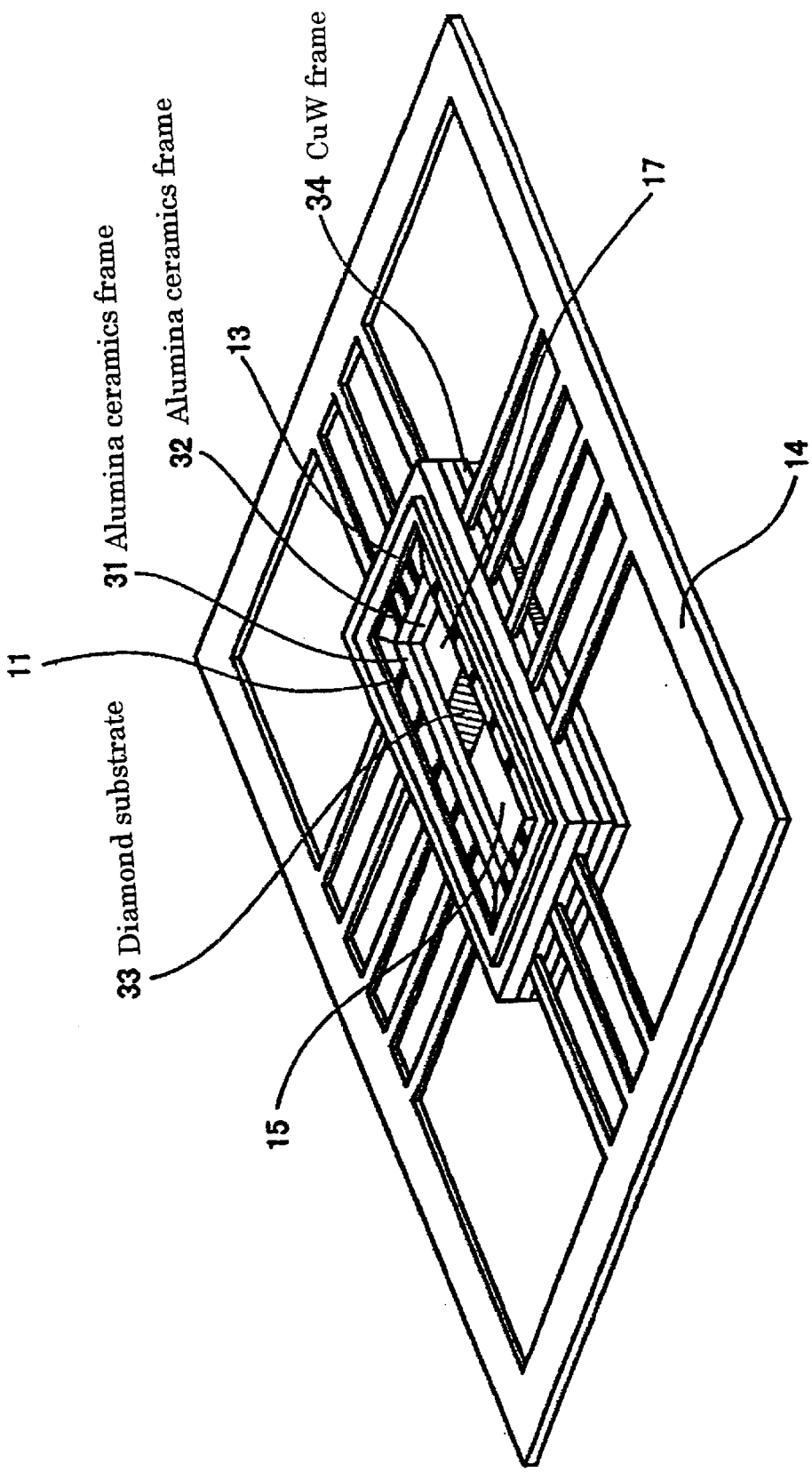
FIG. 4 shows another example of a package of the invention.

In such a package with high performance heat dissipation, it is also necessary to prevent distortion due to thermal expansion at the portion of the package frame, and therefore, in order to suppress the difference in thermal expansion from the substrate, it is preferable that a frame of AlN ceramics is used. Other materials can be used as shown in FIG. 4. However, in this case, a frame of CuW is preferably used between the ceramics frames and the substrate. A conventional Fe—Ni—Co alloy (trade name: Covar) may be used for the lead frame, and the seal ring and the cap as well. The material is not particularly limited, however, a material which does not deform due to the difference in thermal expansion from the AlN ceramics frame should be selected.

In addition, to form the diamond coated substrate, for example, the microwave plasma CVD method is used to coat diamond on the surface of AlN or Si, however, the cost increases if the coating is made thick. It is therefore preferable that the thickness of diamond is set to 50 $\mu$m or less.

The package size to which the present invention can easily be applied is up to approximately 10 mm×10 mm. For example, in the cases of a ceramic leaded chip carrier (PLCC), a leadless chip carrier (LCC), and a pin grid array (PGA), a large-size substrate is to be used, so the use of a diamond substrate or diamond coated substrate for the entire substrate is uneconomical. If the use of the diamond substrate or diamond coated substrate is minimized and one or more kinds of substrates selected from AlN, Si, and CuW are used for other portions, there is a possibility that a large package can be manufactured at relatively low cost.

EXAMPLES

Example 1

Figure 3:
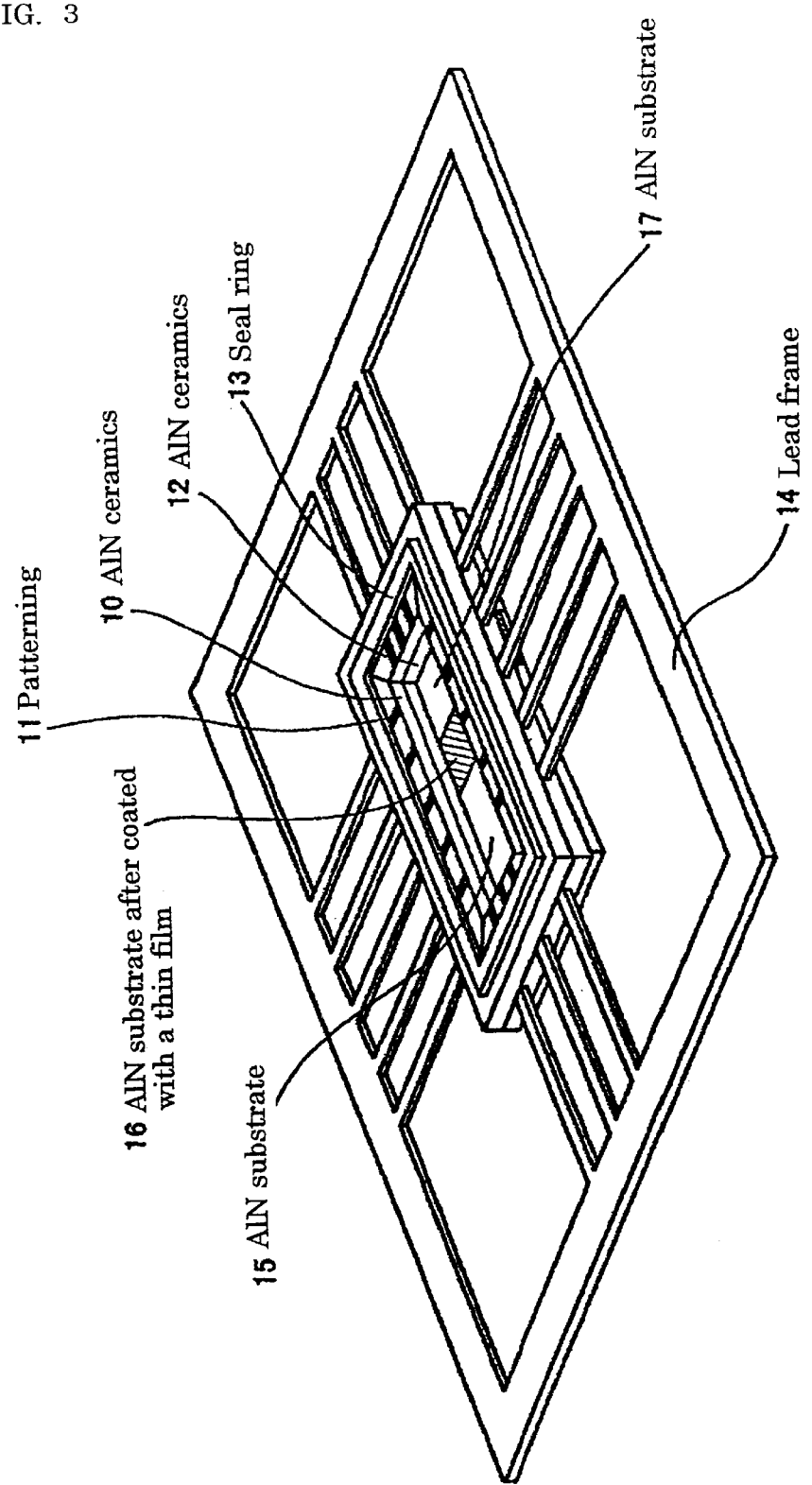
FIG. 3 shows an example of a package of the invention.

As shown in FIG. 3, a ceramic frame is prepared by forming electrode patterning 11 of Ni/Au on AlN ceramics 10 (5.5 mm×8.0 mm×0.5 mm thick) and removing the central portion. Furthermore, AlN ceramics-made electrode frame 12 which has been subjected to electrode patterning treatment is the same size as the abovementioned electrode frame is prepared. Due to the necessity of electric connection of the electrode frames through lead frame 14, the frames are provided with via holes formed therein and subjected to conductor-treatment. Seal ring 13 (5.5 mm×8.0 mm×0.1 mm thick) and lead frame 14 (8.5 mm×11.0 mm×0.1 mm thick) made from an Fe—Ni—Co alloy (Covar) are prepared separately, and adhered in the form shown in FIG. 3 by silver(CuAg)-brazing at 800° C.

The formed frame body is turned over, and substrates are attached to the frame. AlN substrate 15 (3.5 mm×4.5 mm×0.3 mm thick) having a surface metallized by using Ti/Pt/Au in advance, AlN substrate 16 after coated with a diamond thin film (20 μm thick), and AlN substrate (2.0 mm×4.5 mm×0.3 mm thick) metallized in the same manner as mentioned above were adhered by AuSi-brazing at 420° C. After adhering, the surfaces of substrates were ground to be flat. After grinding, Ti/Pt/Au metallizing was applied by means of spattering, whereby package 1 was manufactured.

Example 2

A package frame body was manufactured in the same manner as Example 1, and the same processes as those of Example 1 were performed except for use of a combination of an Si substrate and an AlN substrate following coating with a diamond thin film (diamond thickness: 20 μm), whereby package 2 was manufactured.

Example 3

A package frame body was manufactured in the same manner as Example 1, and the same processes as those of Example 1 were performed except for use of an AlN substrate and an Si substrate following coating with a diamond thin film (diamond thickness: 50 μm), whereby package 3 was obtained.

Example 4

A package frame body was manufactured in the same manner as Example 1, and the same processes as those of Example 1 were performed except for use of an Si substrate and an Si substrate following coating with a diamond thin film (diamond thickness: 50 μm), whereby package 4 was obtained.

Example 5

A package frame body was manufactured in the same manner as Example 1, and the same processes as those of Example 1 were performed except for use of a CuW (89W-11Cu) substrate and an AlN substrate following coating with a diamond thin film (diamond thickness: 20 μm), whereby package 5 was obtained.

Example 6

A package frame body was manufactured in the same manner as Example 1, and the same processes as those of Example 1 were performed except for use of a CuW (89W-11Cu) substrate and an Si substrate following coating with a diamond thin film (diamond thickness: 50 μm), whereby package 6 was obtained.

Example 7

As shown in FIG. 4, alumina ceramics frames 31 and 32 are used for a package frame body, and electrode frames which are the same size as in Example 1 were prepared in the same manner as in Example 1. Next, a seal ring and a lead frame which are the same size and are made of the same materials as those of Example 1 were used and connected by silver-brazing to form a frame body.

This frame body was turned over, and a CuW frame (5.5 mm×8.0 mm×0.5 mm thick) 34 was connected to the frame surface by silver-brazing. On this frame, AlN substrate (3.5 mm×4.5 mm×0.4 mm thick) 15 coated with Ti/Pt/Au, AlN substrate (2.0 mm×4.5 mm×0.4 mm thick) 17 coated with the same material mentioned above, and a diamond substrate coated with the same mentioned metal before (2.5 mm×4.5 mm×0.3 mm thick) 33 were adhered by AuSi-brazing at 420° C. to form a bottom substrate. This bottom substrate was ground so as to have an even surface, on which, a Ti/Pt/Au thin film was formed by spattering, and whereby package 7 was obtained.

Example 8

A frame body of the same kind as the alumina ceramics frame body used in Example 7 was used, and a CuW frame was connected to the frame body in the same manner as in Example 7, and then a Ti/Pt/Au coated Si substrate and a same metal coated diamond substrate were used to manufacture package 8 by the same method as that of Example 7.

Comparative Example 1

Figure 5:
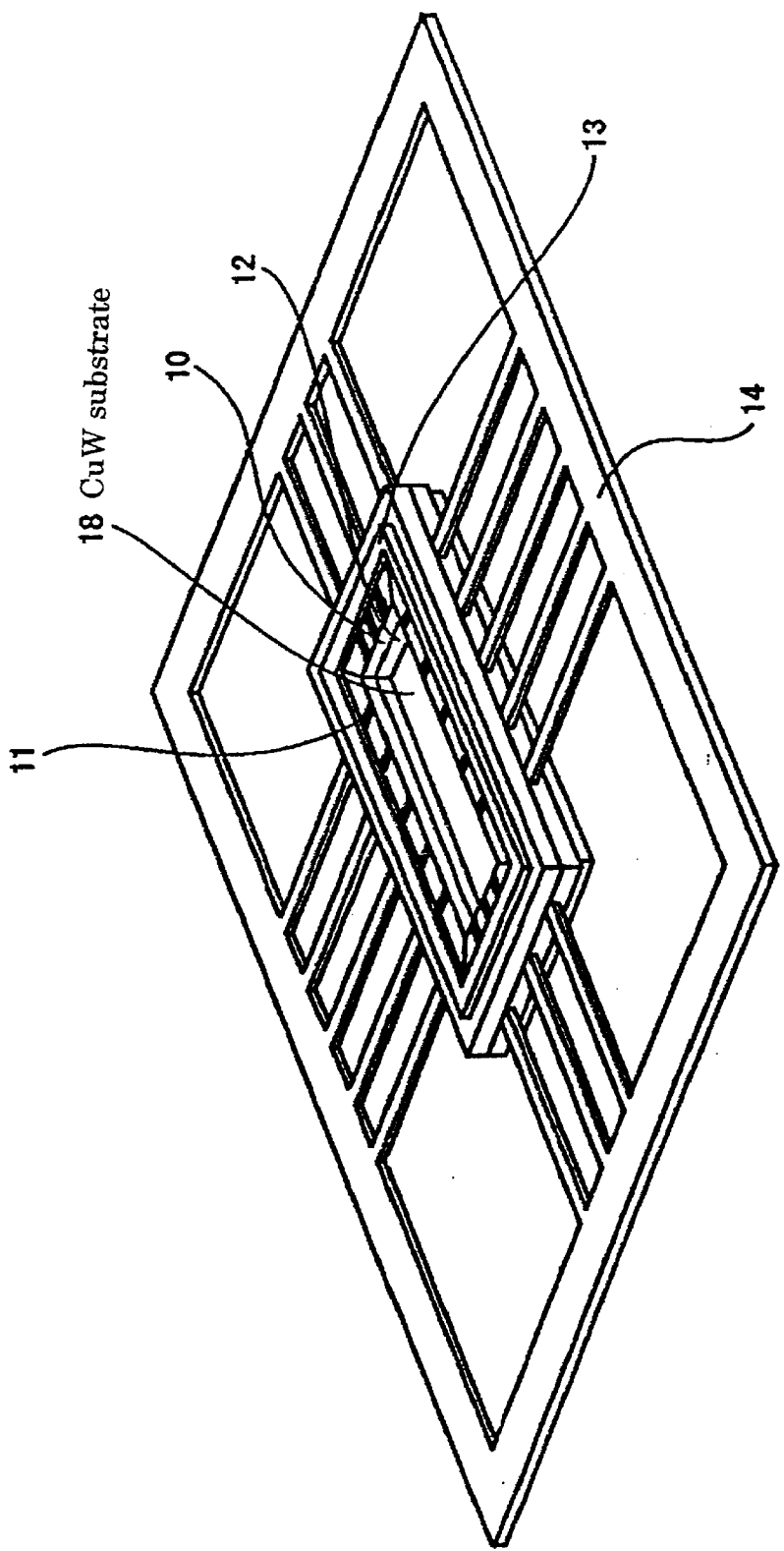
FIG. 5 shows an example of a conventional package.

As shown in FIG. 5, a CuW substrate (7.5 mm×4.5 mm×0.3 mm thick) coated with Ti/Pt/Au was connected by AuSi-brazing to the back surface of a frame body which was formed in the same manner as that of Example 1, whereby package 9 was manufactured.

Comparative Example 2

An AlN substrate (7.5 mm×4.5 mm×0.3 mm thick) having both surfaces coated with Ti/Pt/Au was connected by AuSi-brazing to the back surface of a frame body which was manufactured in the same manner as that of Example 1, whereby package 10 was manufactured.

Figure 6:
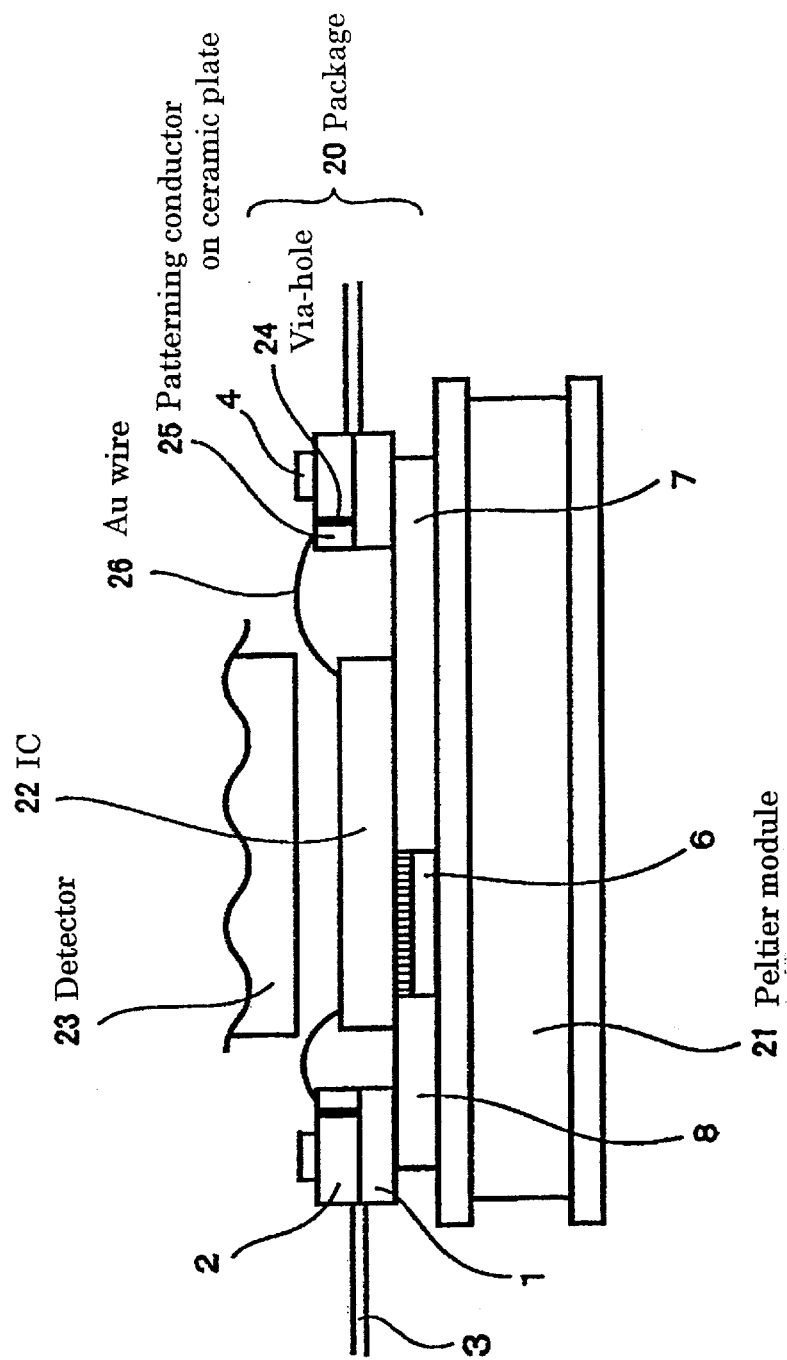
FIG. 6 is a sectional view of the package in a dissipation performance test.

Heat analysis was performed for the 10 kinds of packages manufactured as mentioned above under the conditions as shown by the sectional view of FIG. 6. Package 20 is set on Peltier module 21. The temperature at the package side of the Peltier module is adjusted to be 85° C. in order to suppress scattering in measurements.

Figure 7:
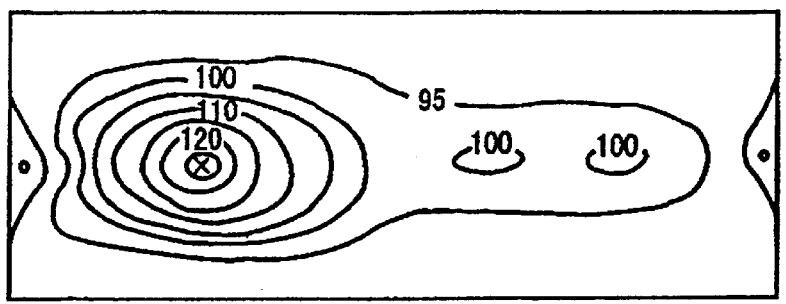
FIG. 7 shows the condition measured by a thermoviewer where the temperature of the IC rises.

IC 22 is mounted on the package 20. The IC is a GaAs-made laser diode driving IC. The temperature measuring detection part 23 of a thermoviewer is set close to the upper surface of this IC 22. The consumed power is approximately 3 W, and the power is supplied through patterning conductor 25 via via-hole 24 from the lead frame 3, and then supplied to the IC 22 through the Au wire 26. By the operation of the IC, heat is generated, and at the point at which heat dissipation and heat generation become balanced, the temperature becomes stable. The temperature at this time is detected by the detection part 23, whereby the temperature at a portion at which the temperature rises to be highest within the IC is measured. The condition of the measurement is illustrated in FIG. 7. FIG. 7 shows the condition where this measurement is made for one of the above Examples, which is the upper surface of the IC viewed by a thermoviewer. The thermoviewer measures the temperature by means of an amount of infrared rays irradiated from an object, and displays the object surface colored by the sensed temperatures. In the figure, this display is converted into isothermal lines. In this measurement, a diamond substrate or diamond coated substrate exists immediately under the position showing the highest temperature (peak temperature) of the isothermal lines.

Thus, the 10 kinds of packages were measured under the same conditions, and the results of the measurements are shown in Table 1. The temperatures of Table 1 show the degree of rise from the standard temperature (85° C.) of the Peltier module.

TABLE 1

| Package No. | Substrate | Highest temperature rising (° C.) |
| --- | --- | --- |
| 1 | D/A, AlN | 44.3 |
| 2 | D/A, Si | 44.4 |
| 3 | D/S, AlN | 44.5 |
| 4 | D/S, Si | 44.6 |
| 5 | D/A, CuW | 44.2 |
| 6 | D/S, CuW | 44.3 |
| 7 | Dia, AlN | 40.0 |
| 8 | Dia, Si | 40.2 |
| 9 (comparative example) | CuW | 46.2 |
| 10 (comparative example) | AlN | 47.5 |

D/A: Diamond coated AlN ceramics substrate
D/S: Diamond coated Si substrate
Dia: Diamond substrate From the abovementioned results, the heat dissipation performance of the package characterized by the substrates of the invention has a superior effect to that of the conventional package.

Although there was concern of the occurrence of distortion due to changes in temperature since the different kinds of substrates are connected, no abnormality was found in a heat cycle test at −40° C. to 125° C., demonstrating this is not a problem.

What is claimed is:

1. A package to be mounted with a semiconductor, comprising a substrate, leads, and an electrode frame, wherein two or more kinds of substrates which are different in heat conductivity are connected and used as said substrate.

2. A package as set forth in claim 1, wherein the substrate is formed by combining one kind of substrate selected from a diamond coated AlN ceramics plate, a diamond coated Si plate, and a diamond plate and one or more kinds of substrates selected from AlN ceramics, Si, and CuW.

3. A package as set forth in claim 1, wherein the electrode frame is formed by applying electrode-patterning AlN ceramics.

4. A package as set forth in claim 1, wherein the electrode frame is formed by using a ceramics frame and a CuW frame.

5. A method of manufacturing a package which is a method of assembling a package, wherein, when connecting substrates to electrode frames of a package, two or more kinds of plates of ceramics or metals which are different in heat conductivity are adhered, and then the back surface of the plates are ground to a flat surface.

6. A method of manufacturing a package as set forth in claim 5, wherein the two or more kinds of plates of ceramics or metals are selected from a diamond plate, an AlN ceramics plate, an Si plate, a CuW plate, a diamond coated AlN ceramics plate, and a diamond coated Si plate, and at the same time, a diamond plate or diamond coated plate is used as one of the plates.

* * * * *